United States Patent
Waggoner et al.

(10) Patent No.: US 12,140,557 B2
(45) Date of Patent: Nov. 12, 2024

(54) METHOD OF FORMING ION SENSORS (71) Applicant: LIFE TECHNOLOGIES CORPORATION, Carlsbad, CA (US)

(72) Inventors: Phil Waggoner, Guilford, CT (US); Jordan Owens, Austin, TX (US); Scott Parker, Madison, CT (US)

(73) Assignee: LIFE TECHNOLOGIES CORPORATION, Carlsbad, CA (US)

( * ) Notice: Subject to any disclaimer, the term of this patent is extended or adjusted under 35 U.S.C. 154(b) by 882 days.

(21) Appl. No.: 17/267,772

(22) PCT Filed: Aug. 16, 2019

(86) PCT No.: PCT/US2019/046914
§ 371 (c)(1),
(2) Date: Feb. 10, 2021

(87) PCT Pub. No.: WO2020/037264
PCT Pub. Date: Feb. 20, 2020

(65) Prior Publication Data
US 2021/0164932 A1    Jun. 3, 2021

Related U.S. Application Data

(60) Provisional application No. 62/719,576, filed on Aug. 17, 2018.

(51) Int. Cl.
*G01N 27/414* (2006.01)
*H01L 21/28* (2006.01)
*H01L 21/3065* (2006.01)

(52) U.S. Cl.
CPC ..... *G01N 27/414* (2013.01); *H01L 21/28185* (2013.01); *H01L 21/28194* (2013.01); *H01L 21/3065* (2013.01)

(58) Field of Classification Search
CPC .. G01N 27/414–4148; H01L 21/76814; H01L 21/02041–09; H01L 2224/0381; H01L 2224/80019; H01L 2224/8001; H01L 21/02068; H01L 21/76883; H01L 21/31122; C23C 16/0227; C23F 4/00
See application file for complete search history.

(56) References Cited

U.S. PATENT DOCUMENTS

| 4,303,467 A | 12/1981 | Scornavacca et al. |
| 5,319,226 A * | 6/1994 | Sohn ..................... G01N 27/414 438/785 |

(Continued)

FOREIGN PATENT DOCUMENTS

WO    WO-2006102064 A2    9/2006

OTHER PUBLICATIONS

PCT/US2019/046914, Search Report and Written Opinion, Nov. 12, 2019, 17 pages.

*Primary Examiner* — Alia Sabur (57) ABSTRACT

A method for manufacturing a sensor includes etching an insulator layer disposed over a substrate to define an opening exposing a sensor surface of a sensor disposed on the substrate, a native oxide forming on the sensor surface; sputtering the sensor surface with a noble gas to at least partially remove the native oxide from the sensor surface; and annealing the sensor surface in a hydrogen atmosphere.

20 Claims, 9 Drawing Sheets

(56) References Cited

U.S. PATENT DOCUMENTS

| | | | |
|---|---|---|---|
| 6,838,334 B1 * | 1/2005 | Gluschenkov | H10B 12/0385 |
| | | | 438/386 |
| 9,995,708 B2 | 6/2018 | Fife et al. | |
| 2012/0037961 A1 * | 2/2012 | Rothberg | G01N 27/4148 |
| | | | 257/253 |
| 2012/0217550 A1 | 8/2012 | Usagawa | |
| 2014/0254472 A1 * | 9/2014 | Wang | H04B 7/026 |
| | | | 370/315 |
| 2014/0264465 A1 | 9/2014 | Fife et al. | |
| 2014/0264471 A1 * | 9/2014 | Fife | G01N 27/4148 |
| | | | 257/253 |
| 2015/0126027 A1 | 5/2015 | Matsumoto et al. | |
| 2016/0326580 A1 | 11/2016 | Rothberg et al. | |
| 2017/0088883 A1 | 3/2017 | Brown et al. | |
| 2019/0164817 A1 * | 5/2019 | Khaderbad | H01L 21/28562 |
| 2020/0035508 A1 * | 1/2020 | Takagi | H01L 21/324 |

* cited by examiner

FIG. 14

METHOD OF FORMING ION SENSORS

CROSS-REFERENCE TO RELATED APPLICATION(S)

This application is a 371 U.S. National Phase Entry Application of International Application No. PCT/US2019/046914 filed Aug. 16, 2019, which claims benefit of U.S. Provisional Application No. 62/719,576, filed Aug. 17, 2018. The entire contents of the aforementioned applications are incorporated by reference herein.

FIELD OF THE DISCLOSURE

This disclosure, in general, relates to methods of forming ion sensors and sensors formed thereby.

BACKGROUND

In industries as diverse as environmental monitoring and genetic sequencing, there is increasing interest in utilizing small-scale sensors to detect changes in ion concentration, such as changes in hydrogen or hydronium ion concentrations indicative of pH. For environmental monitoring, a change in ion concentration in a river may indicate a new mining operation upstream, or may indicate the seasonal change in a lake or the influx of brackish water along coastal tributaries. Further, small-scale ion sensors can be used in biochemical applications, such as genetic sequencing, in which an increase in hydrogen or hydronium ion concentration can indicate the incorporation of a nucleotide on an extending polynucleotide. In each case, the quality of the signal emanating from the ion sensor influences the accuracy of a measurement.

In particular, semiconductor processing used in the formation of such ion sensors influences signal-to-noise ratios and offset potentials associated with the sensors, either weakening the signal relative to environmental noise or creating an offset that makes it difficult to measure or detect the signal. Such issues are particularly pronounced when working with an array of sensors associated with microwells. In an array of sensors, offset variability among sensors in the array leads to difficulty in signal processing. As such, the semiconductor processes that are used to form sensor surfaces can adversely affect the performance of the sensor.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DETAILED DESCRIPTION

In an example embodiment, a process for forming an ion sensitive sensor includes etching an insulation material to form a well, exposing a sensor pad and removing photoresist used in the etching process. The process further includes annealing the ion sensor pad in a hydrogen containing atmosphere and annealing in an oxygen containing atmosphere. Optionally, the sensor pad is disposed at a bottom of a microwell. In an alternative example, a conductive layer can extend over the sensor pad and at least a portion of the sidewalls of the microwell, extending the sensor surface area.

Figure 1:
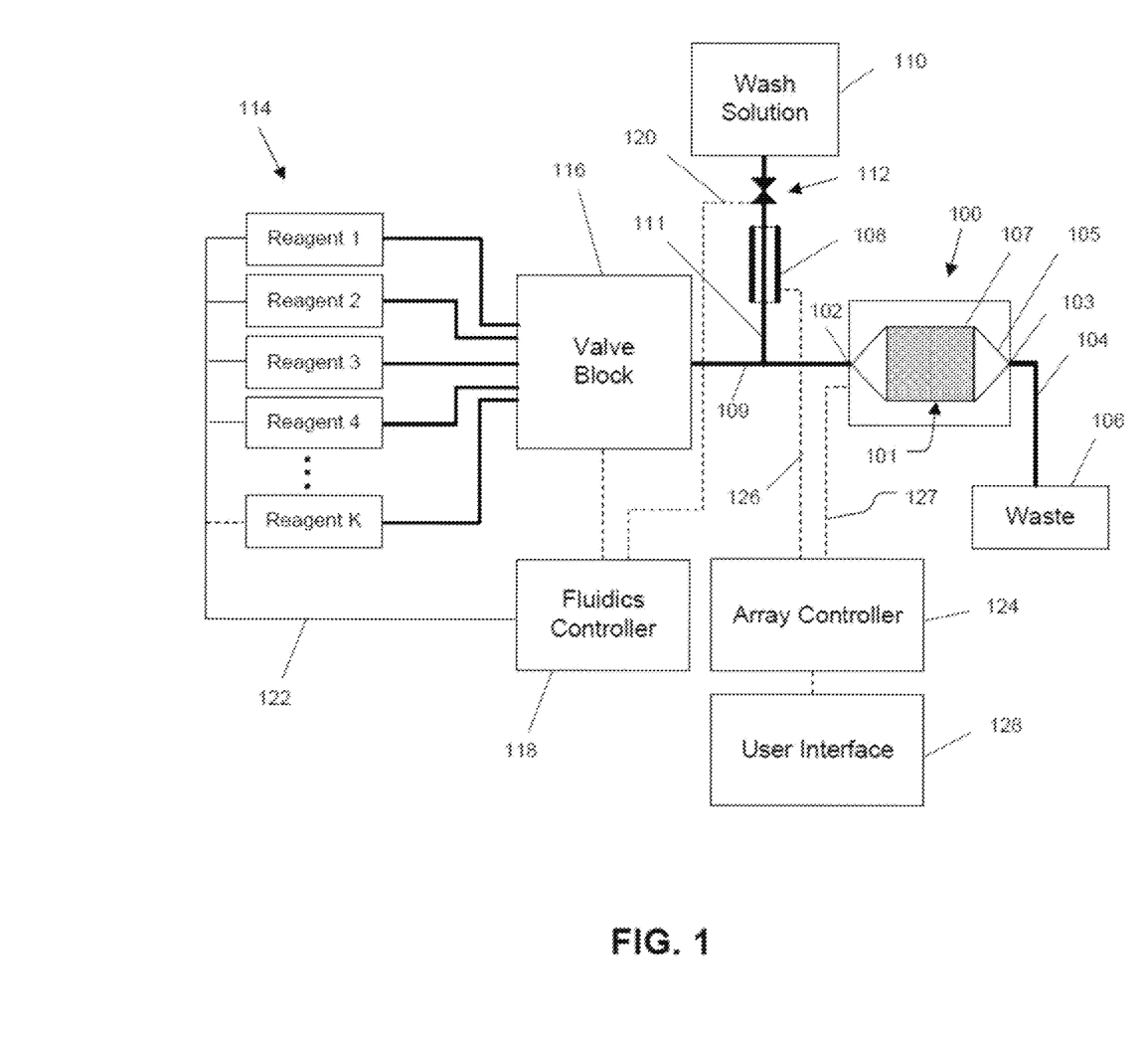
FIG. 1 includes an illustration of an example system for genetic sequencing utilizing an array of ion sensors.

In an example, the ion sensors can be used for genetic sequencing. FIG. 1 illustrates a block diagram of components of a system for nucleic acid sequencing according to an example embodiment. The components include a flow cell 101 on an integrated circuit device 100, a reference electrode 108, a plurality of reagents 114 for sequencing, a valve block 116, a wash solution 110, a valve 112, a fluidics controller 118, lines 120/122/126, passages 104/109/111, a waste container 106, an array controller 124, and a user interface 128. The integrated circuit device 100 includes a microwell array 107 overlying a sensor array that includes chemical sensors as described herein. The flow cell 101 includes an inlet 102, an outlet 103, and a flow chamber 105 defining a flow path for the reagents 114 over the microwell array 107. The reference electrode 108 may be of any suitable type or shape, including a concentric cylinder with a fluid passage or a wire inserted into a lumen of passage 111. The reagents 114 may be driven through the fluid pathways, valves, and flow cell 101 by pumps, gas pressure, vacuum, or other suitable methods, and may be discarded into the waste container 106 after exiting the outlet 103 of the flow cell 101. The fluidics controller 118 may control driving forces for the reagents 114 and the operation of valve 112 and valve block 116 with suitable software.

The microwell array 107 includes reaction regions, also referred to herein as microwells, which are operationally associated with corresponding chemical sensors in the sensor array. For example, each reaction region may be coupled to a chemical sensor suitable for detecting an analyte or reaction property of interest within that reaction region. The microwell array 107 may be integrated in the integrated circuit device 100, so that the microwell array 107 and the sensor array are part of a single device or chip. The flow cell 101 may have a variety of configurations for controlling the path and flow rate of reagents 114 over the microwell array 107. The array controller 124 provides bias voltages and timing and control signals to the integrated circuit device 100 for reading the chemical sensors of the sensor array. The array controller 124 also provides a reference bias voltage to the reference electrode 108 to bias the reagents 114 flowing over the microwell array 107.

In operation, the array controller 124 collects and processes output signals from the chemical sensors of the sensor array through output ports on the integrated circuit device 100 via bus 127. The array controller 124 may be a computer or other computing means. The array controller 124 may include memory for storage of data and software applications, a processor for accessing data and executing applications, and components that facilitate communication with the various components of the system in FIG. 1. In the illustrated embodiment, the array controller 124 is external to the integrated circuit device 100. In some alternative embodiments, some or all of the functions performed by the array controller 124 are carried out by a controller or other data processor on the integrated circuit device 100. The values of the output signals from the chemical sensors indicate physical or chemical parameters of one or more reactions taking place in the corresponding reaction regions in the microwell array 107. The user interface 128 may display information about the flow cell 101 and the output signals received from chemical sensors in the sensor array on the integrated circuit device 100. The user interface 128 may also display instrument settings and controls, and allow a user to enter or set instrument settings and controls.

In some embodiments, the fluidics controller 118 may control delivery of the individual reagents 114 to the flow cell 101 and integrated circuit device 100 in a predetermined sequence, for predetermined durations, at predetermined flow rates. The array controller 124 can then collect and analyze the output signals of the chemical sensors indicating chemical reactions occurring in response to the delivery of the reagents 114. During the experiment, the system may also monitor and control the temperature of the integrated circuit device 100, so that reactions take place and measurements are made at a known predetermined temperature.

The system may be configured to let a single fluid or reagent contact the reference electrode 108 throughout an entire multi-step reaction during operation. The valve 112 may be shut to prevent any wash solution 110 from flowing into passage 109 as the reagents 114 are flowing. Although the flow of wash solution may be stopped, there may still be uninterrupted fluid and electrical communication between the reference electrode 108, passage 109, and the microwell array 107. The distance between the reference electrode 108 and the junction between passages 109 and 111 may be selected so that little or no amount of the reagents flowing in passage 109 (and possibly diffusing into passage 111) reaches the reference electrode 108. In an example embodiment, the wash solution 110 may be selected as being in continuous contact with the reference electrode 108, which may be especially useful for multi-step reactions using frequent wash steps.

Figure 2:
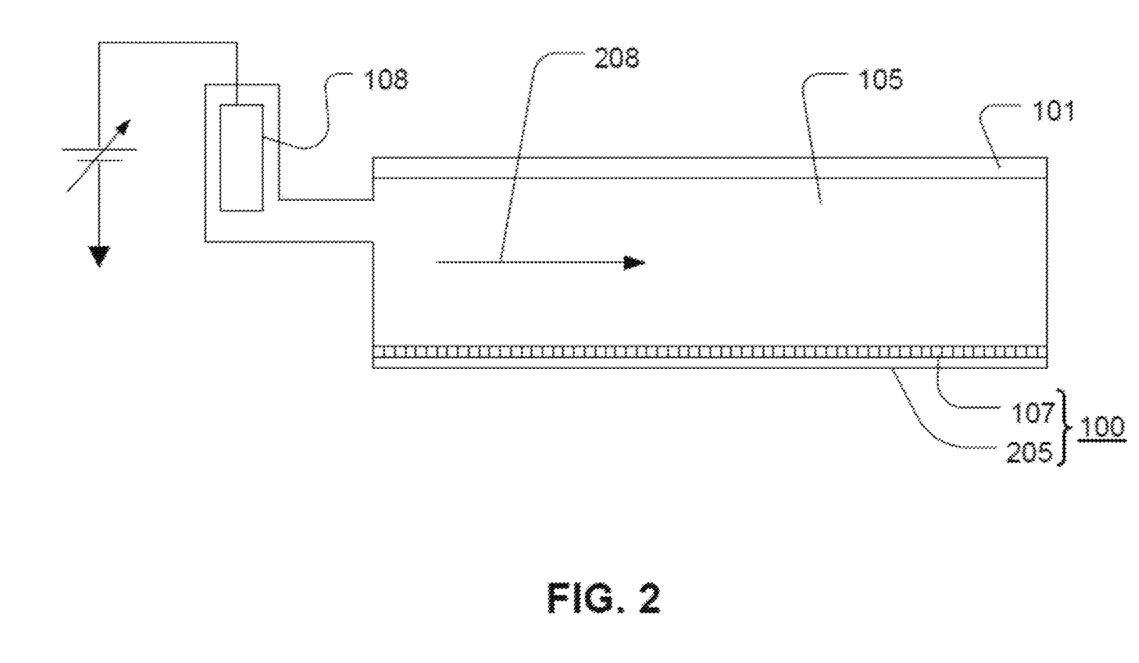
FIG. 2 includes an illustration of an example sensor and flow cell.

FIG. 2 illustrates cross-sectional and expanded views of a portion of the integrated circuit device 100 and flow cell 101. The integrated circuit device 100 includes the microwell array 107 of reaction regions operationally associated with sensor array 205. During operation, the flow chamber 105 of the flow cell 101 confines a reagent flow 208 of delivered reagents across open ends of the reaction regions in the microwell array 107. The volume, shape, aspect ratio (such as base width-to-well depth ratio), and other dimensional characteristics of the reaction regions may be selected based on the nature of the reaction taking place, as well as the reagents, byproducts, or labeling techniques (if any) that are employed. The chemical sensors of the sensor array 205 are responsive to (and generate output signals related to) chemical reactions within associated reaction regions in the microwell array 107 to detect an analyte or reaction property of interest. The chemical sensors of the sensor array 205 may for example be chemically sensitive field-effect transistors (chemFETs), such as ion-sensitive field effect transistors (ISFETs).

Provided herein is a device for detecting a reaction. The reaction may be localized to a reaction region and multiple reactions of the same type may occur in the same reaction region. The reaction that may occur may be a chemical reaction that results in the detection of a reaction by-product or the detection of a signal indicating a reaction. A sensor may be located in proximity to the reaction region and may detect the reaction by-product or the signal. The sensor may be a CMOS type of sensor. In some embodiments, the sensor may detect a hydrogen ion, hydronium ion, hydroxide ion, or the release of pyrophosphate. In some embodiments, the sensor may detect the presence of a charged probe molecule.

Figure 3:
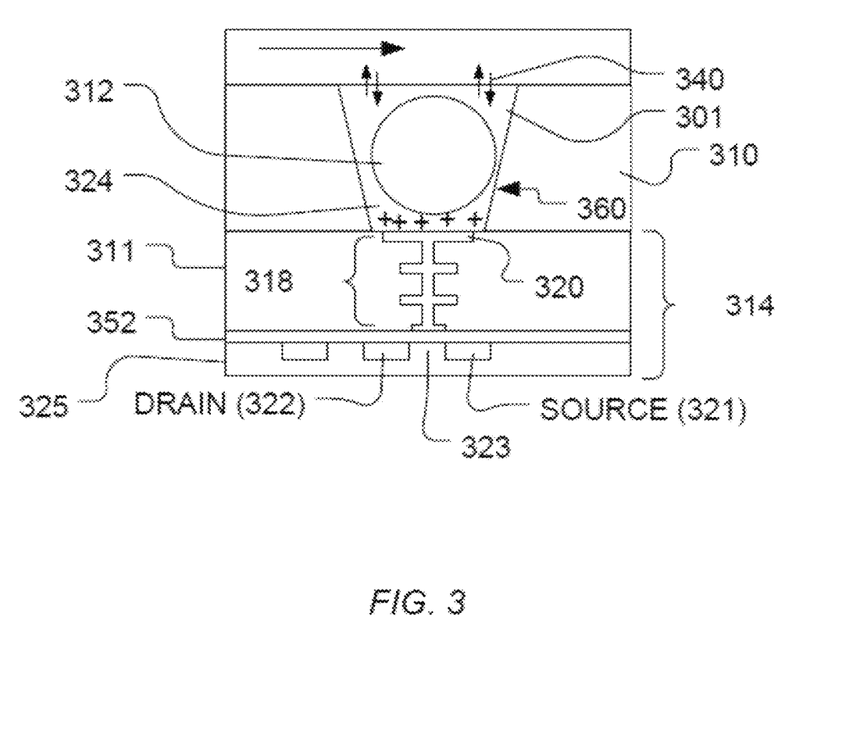
FIG. 3 includes an illustration of an example sensor.

FIG. 3 illustrates a representative reaction region 301 and a chemical sensor 314. The reaction region may be an opening such as a well, depression, or channel. Alternatively, the reaction region may be an area where any suitable reaction takes place. A sensor array may have millions of these chemical sensors 314 and reaction regions 301. The chemical sensor 314 may be a chemically-sensitive field effect transistor (chemFET), or more specifically an ion-sensitive field effect transistor (ISFET). The chemical sensor 314 includes a floating gate structure 318 having a sensor plate 320 coupled to a reaction region 301 via an electrically conductive layer within the reaction region 301. The floating gate structure 318 may include multiple layers of conductive material within layers of dielectric material or may include a single layer of conductive material within a single layer of dielectric material 311. The chemical sensor may include a source 321 and a drain 322 located within the substrate. The source 321 and the drain 322 include doped semiconductor material having a conductivity type different from the conductivity type of the substrate. For example, the source 321 and the drain 322 may comprise doped P-type semiconductor material, and the substrate may comprise doped N-type semiconductor material. A channel 323 separates the source 321 and the drain 322. The floating gate structure 318 overlies the channel region 323, and is separated from the substrate by a gate dielectric 352. The gate dielectric 352 may be for example silicon dioxide. Alternatively, other dielectrics may be used for the gate dielectric 352.

As shown in FIG. 3, the reaction region 301 is within an opening extending through dielectric materials 310 to the upper surface of the sensor plate 320. The dielectric material 310 may comprise one or more layers of material, such as silicon dioxide or silicon nitride. The opening also includes an upper portion 315 within the dielectric material 310 and extends from the chemical sensor 314 to the upper surface of the dielectric material 310. In some embodiments, the width of the upper portion of the opening is substantially the same as the width of the lower portion of the reaction region. Alternatively, depending on the material(s) or etch process used to create the opening, the width of the upper portion of the opening may be greater than the width of the lower portion of the opening, or vice versa. The opening may for example have a circular cross-section. Alternatively, the opening may be non-circular. For example, the cross-section may be square, rectangular, hexagonal, or irregularly shaped. The dimensions of the openings, and their pitch, can vary from embodiment to embodiment. In some embodiments, the openings can have a characteristic diameter, defined as the square root of 4 times the plan view cross-sectional area (A) divided by Pi (e.g., sqrt($4*A/\pi$)), of not greater than 5 micrometers, such as not greater than 3.5 micrometers, not greater than 2.0 micrometers, not greater than 1.6 micrometers, not greater than 1.0 micrometers, not greater than 0.8 micrometers, not greater than 0.6 micrometers, not greater than 0.4 micrometers, not greater than 0.2 micrometers or even not greater than 0.1 micrometers, but, optionally, at least 0.001 micrometers, such as at least 0.01 micrometers.

In some embodiments, during manufacturing or operation of the device, an electrically conductive material is formed as part of the sensor, and a thin oxide of the material of the electrically conductive material may be grown or deposited which acts as a sensing material (e.g. an ion-sensitive sensing material) for the chemical sensor. Whether an oxide is formed depends on the conductive material, the manufacturing processes performed, and the conditions under which the device is operated. For example, in some embodiments the electrically conductive element may be titanium nitride, and titanium oxide or titanium oxynitride may be grown on the inner surface of the conductive material during manufacturing or during exposure to solutions during use. The electrically conductive element may comprise one or more layers of a variety of electrically conductive materials, such as metals or ceramics. The conductive material can be for example a metallic material or alloy thereof, or can be a ceramic material, or a combination thereof. An example metallic material includes one of aluminum, copper, nickel, titanium, silver, gold, platinum, hafnium, lanthanum, tantalum, tungsten, iridium, zirconium, palladium, or a combination thereof. An example ceramic material includes one of titanium nitride, titanium aluminum nitride, titanium oxynitride, tantalum nitride or a combination thereof. In some alternative embodiments, an additional conformal sensing material is deposited on the conductive element and within the openings. The sensing material may comprise one or more of a variety of different materials to facilitate sensitivity to particular ions. For example, metal oxides such as zinc oxide, aluminum or tantalum oxides, generally provide sensitivity to hydrogen ions, whereas sensing materials comprising polyvinyl chloride containing valinomycin provide sensitivity to potassium ions. Materials sensitive to other ions such as sodium, silver, iron, bromine, iodine, calcium, and nitrate may also be used, depending upon the embodiment.

In operation, reactants, wash solutions, and other reagents may move in and out of the reaction region 301 by a diffusion mechanism 340. The chemical sensor 314 is responsive to (and generates an output signal related to) the amount of charge 324 proximate to the sensor plate 320. The presence of charge 324 in an analyte solution alters the surface potential at the interface between the sensor plate 320 and the analyte solution within the reaction region 301. Changes in the charge 324 cause changes in the voltage on the floating gate structure 318, which in turn changes the threshold voltage of the transistor. This change in threshold voltage can be measured by measuring the current in the channel region 323 between the source 321 and a drain 322. As a result, the chemical sensor 314 can be used directly to provide a current-based output signal on an array line connected to the source 321 or drain 322, or indirectly with additional circuitry to provide a voltage-based output signal.

In some embodiments, reactions carried out in the reaction region 301 can be analytical reactions to identify or determine characteristics or properties of an analyte of interest. Such reactions can generate directly or indirectly byproducts that affect the amount of charge adjacent sensor plate 320 or any other materials or coatings that may be placed on the sensor plate to increase sensitivity. If such byproducts are produced in small amounts or rapidly decay or react with other constituents, multiple copies of the same analyte may be analyzed in the reaction region 301 at the same time in order to increase the output signal generated. In some embodiments, multiple copies of an analyte may be attached to a solid phase support 312, as shown in FIG. 3, either before or after deposition into the reaction region 301. The solid phase support 312 may be a particle, microparticle, nanoparticle, or bead. The solid phase support may be solid or porous or may be a gel, or a combination thereof. The solid support may be a structure located in the middle of the reaction region. Alternatively, the solid support may be located at the bottom of the reaction region. For a nucleic acid analyte, multiple, connected copies may be made by rolling circle amplification (RCA), exponential RCA, Recombinase Polymerase Amplification (RPA), Polymerase Chain Reaction amplification (PCR), emulsion PCR amplification, or like techniques, to produce an amplicon without the need of a solid support.

In various example embodiments, the methods and systems described herein may advantageously be used to process or analyze data and signals obtained from electronic or charged-based nucleic acid sequencing. In electronic or charged-based sequencing (such as, pH-based sequencing), a nucleotide incorporation event may be determined by detecting ions (e.g., hydrogen ions) that are generated as natural by-products of polymerase-catalyzed nucleotide extension reactions. This detection method may be used to sequence a sample or template nucleic acid, which may be a fragment of a nucleic acid sequence of interest, for example, and which may be directly or indirectly attached as a clonal population to a solid support, such as a particle, microparticle, bead, etc. The sample or template nucleic acid may be operably associated to a primer and polymerase and may be subjected to repeated cycles or "flows" of deoxynucleotide triphosphate ("dNTP") addition (which may be referred to herein as "nucleotide flows" from which nucleotide incorporations may result) and washing. The primer may be annealed to the sample or template so that the primer's 3' end can be extended by a polymerase whenever dNTPs complementary to the next base in the template are added. Then, based on the known sequence of nucleotide flows and on measured output signals of the chemical sensors indicative of ion concentration during each nucleotide flow, the identity of the type, sequence and number of nucleotide(s) associated with a sample nucleic acid present in a reaction region coupled to a chemical sensor can be determined.

Figure 4:
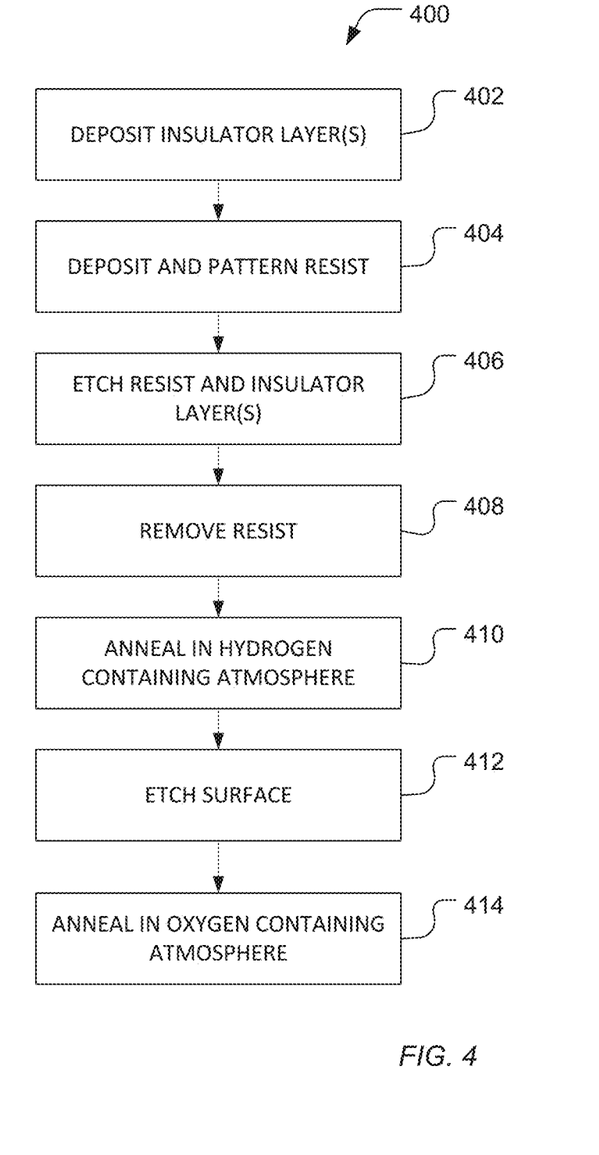
FIG. 4 includes a block flow diagram illustrating an example method for forming and ion sensor.

FIG. 4 illustrates an example method 400 for forming an ion sensor. The method 400 includes depositing one or more insulator layers over a substrate and sensors pads of electronics formed on or in the substrate, as illustrated at block 402. The one or more insulator layers can be deposited or grown, for example, using chemical vapor deposition, such as plasma-enhanced chemical vapor deposition. In an example, the insulator layer can include silicon dioxide, silicon nitride, or a low temperature oxide formed, for example, from TEOS. In a further example, layers can be formed of silicon oxide, followed by a layer of silicon nitride disposed over the layer of silicon oxide, and optionally a layer of low temperature oxide formed from TEOS disposed over the silicon nitride layer.

Figure 5:
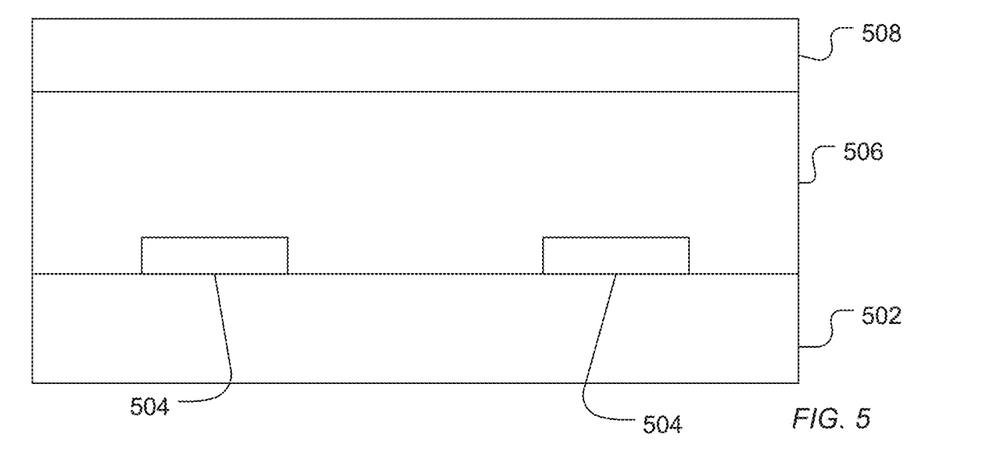
FIG. 5, FIG. 6, FIG. 7, and FIG. 8 include illustrations of workpieces and a process for forming ion sensors.

As illustrated at block 404, a photoresist layer can be deposited and patterned to allow an opening to form over the sensor pad extending through the insulator material. For example, as illustrated in FIG. 5, sensor pads 504 can be disposed in or on a substrate 502. In an example, the substrate 502 can include a silicon-based substrate. In another example, substrate can include a gallium arsenide substrate or a sapphire substrate. The sensor pads can be formed of zinc, copper, aluminum, tantalum, titanium, tungsten, gold, silver, oxides thereof, nitrides thereof, or combinations thereof. In an example, the sensor pads can include titanium. In another example, the sensors pads can include a conductive ceramic, such as titanium nitride. One or more insulator layers 506 can be deposited over the substrate 502 and the sensor pads 504, and a photoresist layer 508 can be coated over the insulator layer or layers 506. In particular, the insulator layer or layers 506 can be formed by chemical vapor deposition. Optionally, the photoresist layer 508 can be formed by spin coating.

Figure 6:
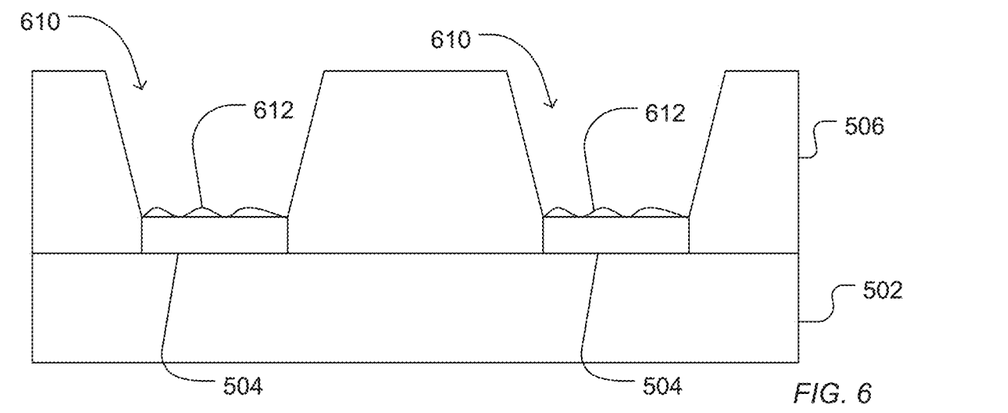

Returning to FIG. 4, the insulator layers and resist can be etched, as illustrated at block 406. The process can include a wet etch, a plasma etch, or a combination thereof. In particular, the process can include a plasma etch, such as a fluorine containing plasma etch. In another example, the wet etch can include a bromine etch or a hydrogen fluoride etch. In a particular example, a plasma etch can be followed by a wet etch and wash. Following etching, the photoresist can be removed such as through ashing, as illustrated at block 408. Often, a native oxide forms as a result of the etching and ashing processes. For example, as illustrated in FIG. 6, microwells 610 are formed through the insulator materials 506 to expose the sensor pads 504. On the surface of the sensor pads 504, a native oxide 612 can form. Typically, such an oxide is non-uniform and varies in both thickness and quality across the surface of the sensor pad 504.

Figure 7:
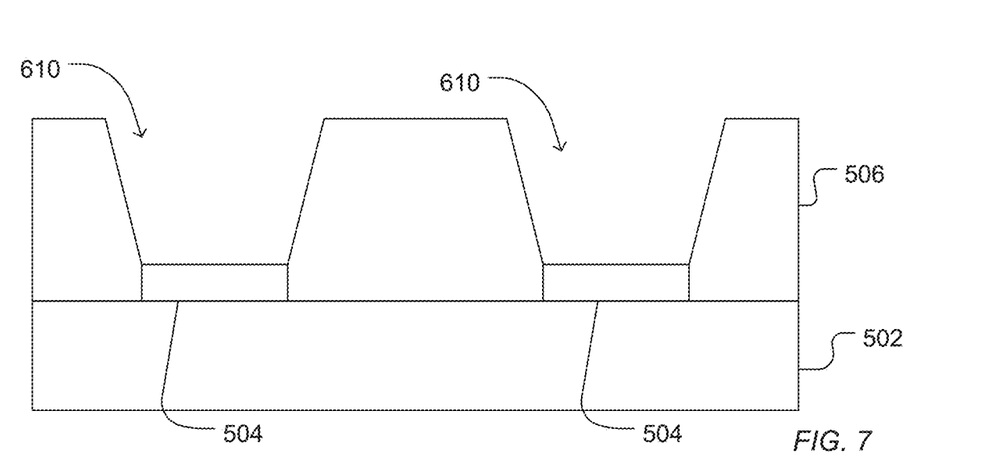

Returning to FIG. 4, the sensor pads can be annealed in a hydrogen containing atmosphere, as illustrated at block 410. Annealing can be performed at a temperature in a range of 300° C. to 500° C., such as a range of 400° C. to 450° C. As illustrated in FIG. 7, the surface 714 of the sensor pads 504 are free of native oxide and can be relatively uniform in thickness and composition.

Optionally, the surface can be further etched to remove oxygen depleted regions on the surface of the sensor pad, as illustrated at 412. For example, surface oxides and optionally oxygen depleted regions within the surface are removed through the optional surface etch. In an example, the surface etch includes a vapor hydrogen fluoride etch (VHF etch).

Figure 8:
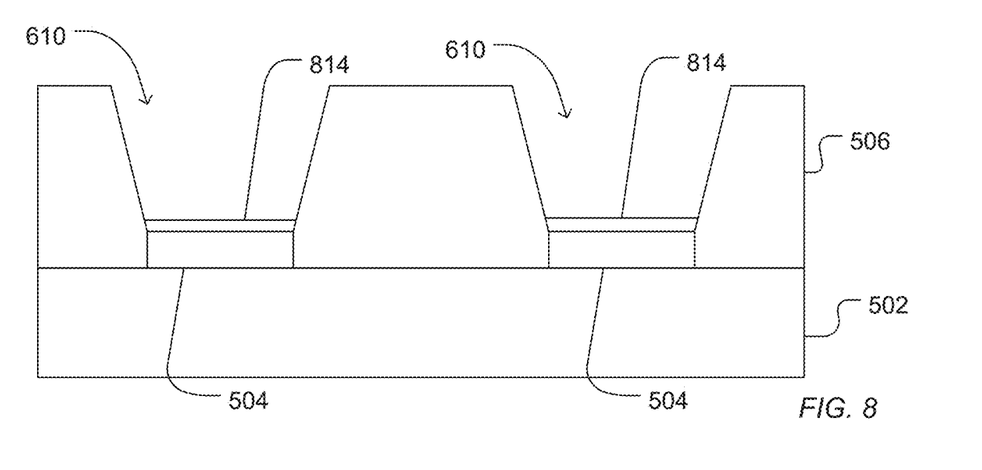

In addition, the sensor pads can be annealed an oxygen containing atmosphere at a temperature of less than 400° C., as illustrated at block 414. For example, the sensor pads can be exposed to temperatures in a range of 290° C. to 380° C., such as a range of 300° C. to 370° C., a range of 330° C. to 360° C., or a range of 345° C. to 355° C. Selection of temperature has been found to affect the performance of the sensors. In an example, the sensor pads can be exposed to the oxygen containing atmosphere for a period in a range of 5 minutes to 120 minutes, such as a range of 10 minutes to 80 minutes, a range of 15 minutes to 60 minutes, or a range of 15 minutes to 45 minutes. As illustrated in FIG. 8, a uniform oxide layer 814 is disposed over the sensor pad 514. Such a uniform oxide layer 814 provides for consistent performance of an array or across an array of sensors.

In another example, an additional conductive layer can be disposed over the sensor pad and optionally, extend at least a portion along the walls of the microwell. For example, FIG. 9 includes a method 900 for forming the additional conductive layer. Following the etching and ashing processes used to form the microwell over the sensor pad, the surface of the sensor pad is optionally sputtered using a noble gas, such as argon, as illustrated at block 902. Such optional sputtering can prepare the surface of the sensor pad for contact with the conductive layer. For example, a native oxide can be substantially removed from the surface of the sensor pad. In an example, the sputtering can be performed at a power in a range of 100 W to 400 W, such as a range of 250 W to 350 W. In particular, the sputter is sufficient to remove 1-10 nanometers of oxide.

Figure 9:
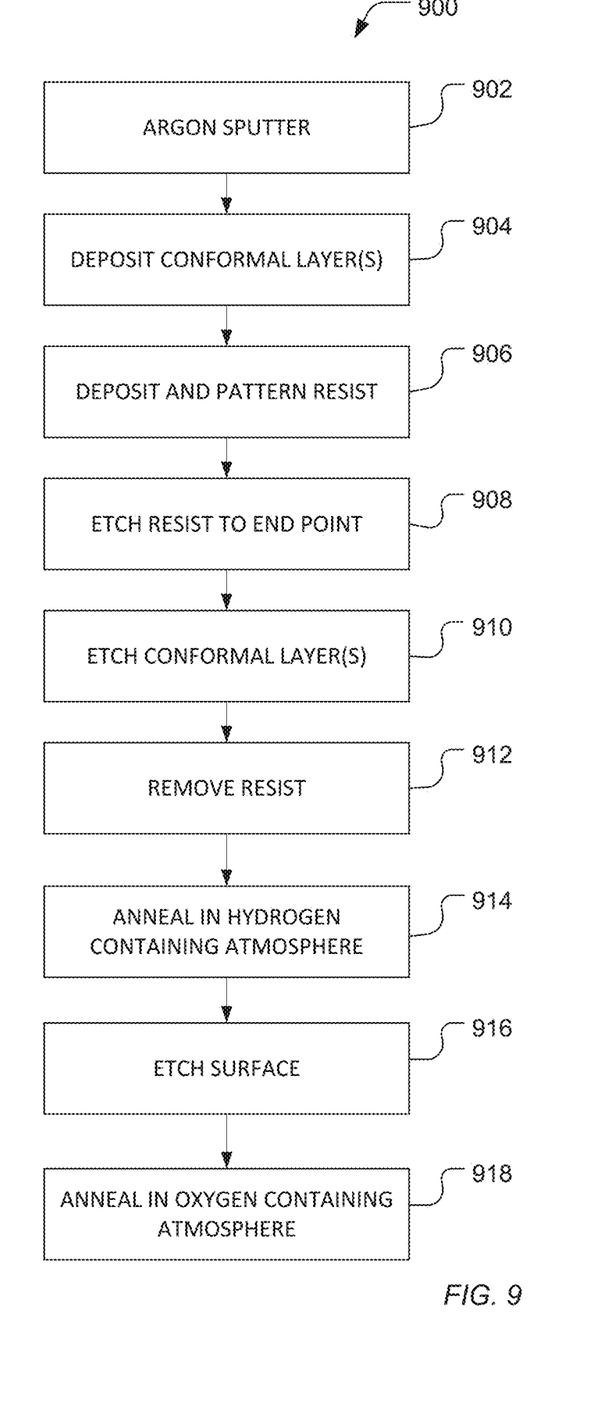
FIG. 9 includes a block flow diagram illustrating an example method for forming and ion sensor.

Following the argon sputter, a conformal layer can be deposited over the sensor pad and insulator layers, as illustrated at block 904. For example, the conformal layer can be deposited using sputtering technique. The conformal conductive layer can, for example, be formed from titanium, tantalum, hafnium, tungsten, aluminum, copper, gold, silver, or any combination thereof. In an example, the conformal layer is formed of titanium. In another example, the conformal layer is tantalum.

Figure 10:
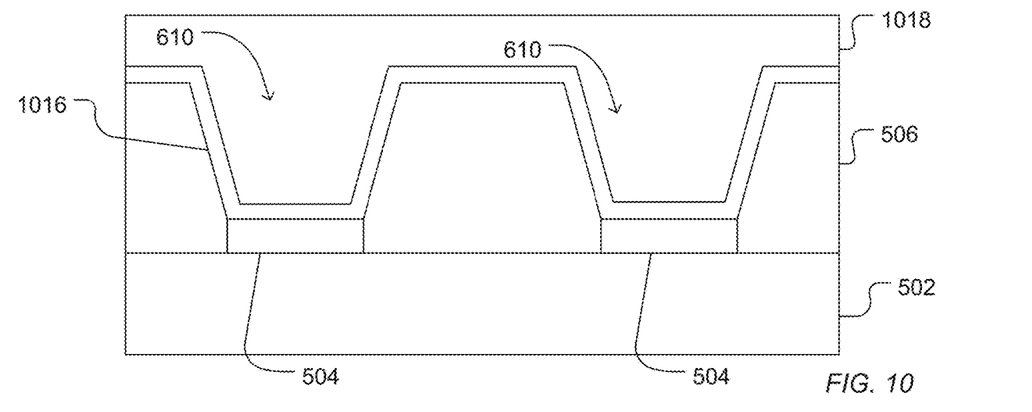
FIG. 10, FIG. 11, FIG. 12, FIG. 13, and FIG. 14 include illustrations of workpieces during a process for the formation of an ion sensor.

Following deposition of the conformal layer, a photoresist layer can be deposited and pattern, as illustrated at block 906. For example, the photoresist layer can be spin coated over the conformal conductive layer, forming photoresist within the wells and over the surface of the substrate. For example, as illustrated in FIG. 10, a conformal layer 1016 is deposited over the insulation layer 506 and the sensor pads 504. A photoresist layer 1018 is deposited over the conformal layer 1016 and enters the microwells 610.

Figure 11:
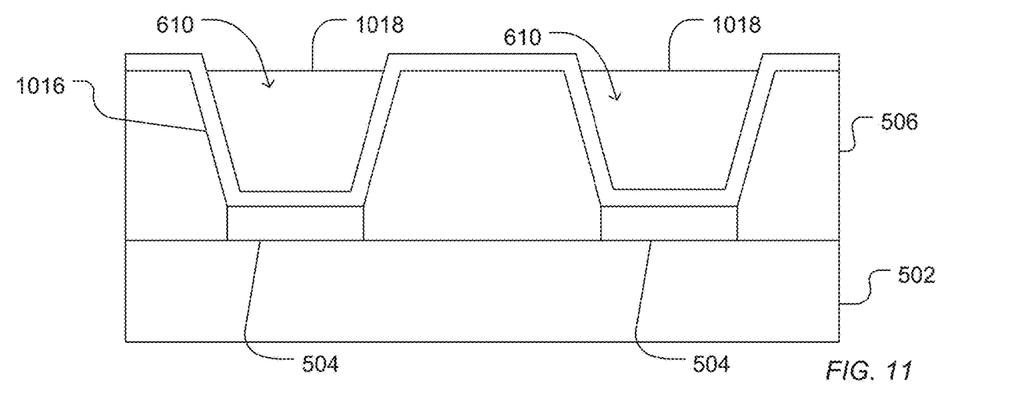

Returning to FIG. 9, the photoresist can be etched to an endpoint, as illustrated at block 908. In an example, the process may use endpoint detection to detect exposure of the conformal layer 1016. For example, as illustrated in FIG. 11, the photoresist 1018 is etched to expose portions of the conformal conductive layer 1016 disposed on top of the insulating layer 506, while protecting the portions of the conformal layer 1016 disposed within the wells 610. The etch can be a wet etch, a plasma etch, or a chemical mechanic planarization process.

Figure 12:
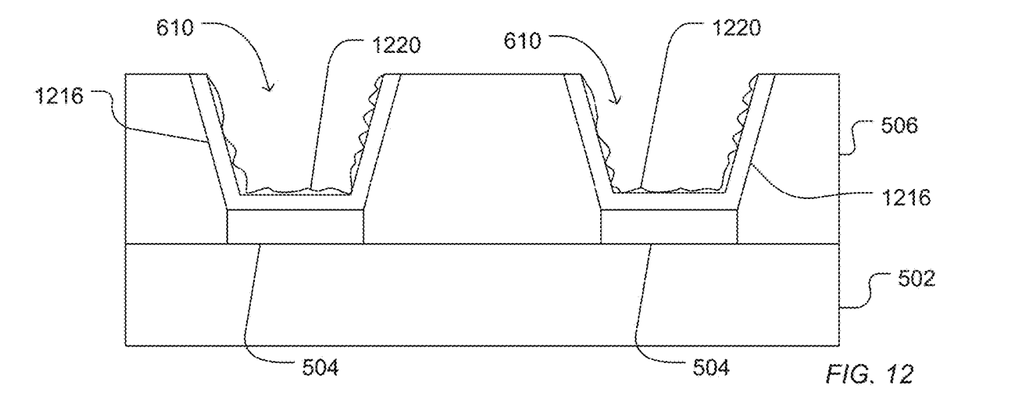

As illustrated at block 910, the conformal layer can be etched. For example, conformal layer can be etched using a wet etch process, a plasma etch process, or a chemical mechanical polishing process. In a particular example, the conformal layers are etched using a plasma process. Further, the photoresist can be removed, as illustrated at block 912, such as through ashing. As illustrated in FIG. 12, the etching and ashing process can leave a non-uniform native oxide layer 1220 over a surface of the conductive layer 1216 formed from the conformal conductive layer 1016.

Figure 13:
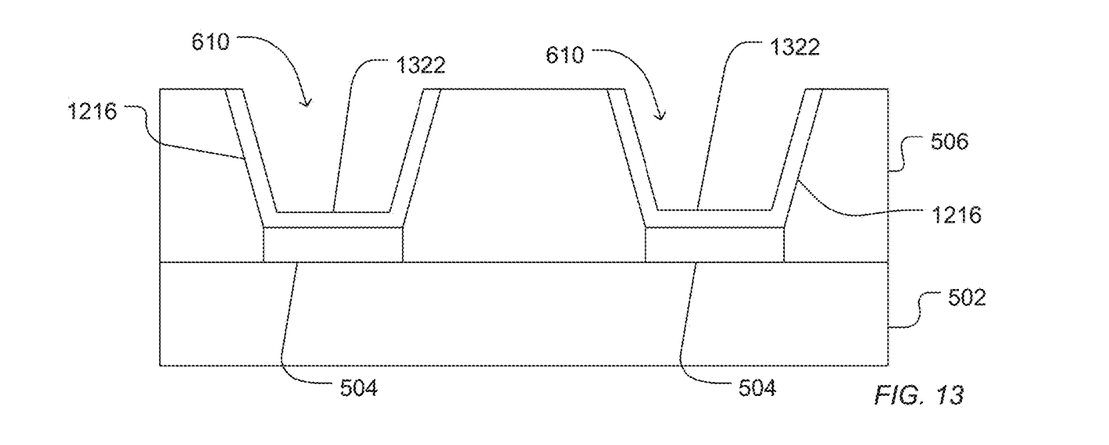

As illustrated at block 914, the sensor surface can be annealed in a hydrogen containing atmosphere. Such annealing can deplete oxygen from regions of the sensor pad or conformal layer, including thin native oxide. Optionally, the surface can be etched to remove the oxygen depleted regions, as illustrated at block 916 providing for a uniform surface over the conductive layer 1216. In particular, the etch is sufficient to remove 1-10 nanometers. For example, as illustrated in FIG. 13, a uniform surface 1322 is formed over the conductive layer 1216.

Figure 14:
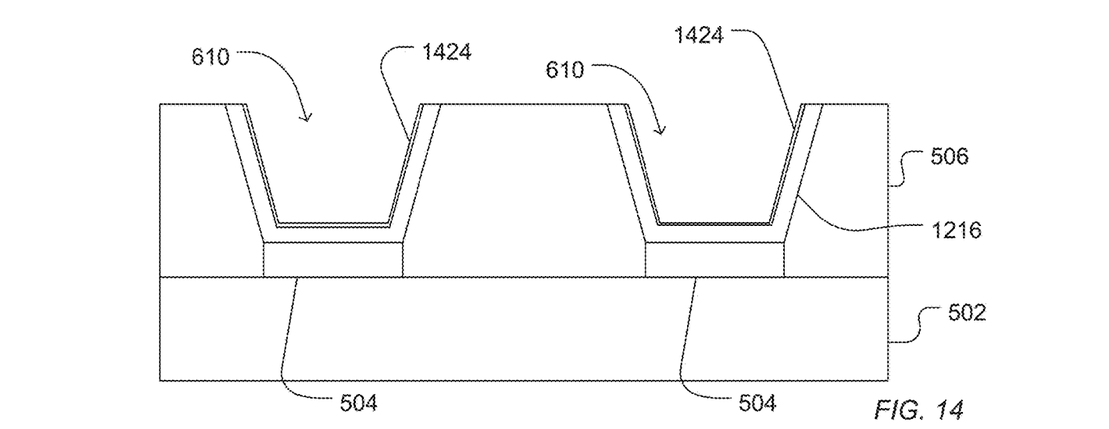

Returning to FIG. 9, the surface can be further annealed in an oxygen containing atmosphere, as illustrated block 918. For example, the sensor pads can be exposed to temperatures of less than 400° C., such as in a range of 290° C. to 380° C., a range of 300° C. to 370° C., a range of 330° C. to 360° C., or a range of 345° C. to 355° C. As illustrated in FIG. 14, a uniform oxide layer 1424 can be formed over the conductive layer 1216, extending the sensor surface area of the sensor pad 504.

In a first embodiment, a method for manufacturing a sensor includes etching an insulator layer disposed over a substrate to define an opening exposing a sensor surface of a sensor disposed on the substrate. A native oxide forming on the sensor surface. The method further includes annealing the sensor surface in a hydrogen containing atmosphere and annealing the senor surface in an oxygen atmosphere at a temperature of not greater than 400° C.

In an example of the first embodiment, annealing the sensor surface in an oxygen containing atmosphere includes annealing at a temperature in a range of 290° C. to 380° C. For example, the temperature is in a range of 300° C. to 370° C., such as in a range of 330° C. to 360° C.

In another example of the first embodiment and the above examples, annealing the sensor surface in an oxygen containing atmosphere includes annealing for a period in a range of 5 minutes to 120 minutes. For example, the period is in a range of 10 minutes to 80 minutes, such as in a range of 15 minutes to 60 minutes.

In a further example of the first embodiment and the above examples, annealing in a hydrogen containing atmosphere includes annealing at a temperature in a range of 350° C. to 500° C. For example, annealing in the hydrogen containing atmosphere includes annealing at a temperature in a range of 400° C. to 450° C.

In an additional example of the first embodiment and the above examples, the method further includes etching the sensor surface following annealing in a hydrogen containing atmosphere and before annealing in an oxygen containing atmosphere. For example, etching the sensor surface following annealing in the hydrogen containing atmosphere includes etching in a vapor hydrogen fluoride atmosphere.

In another example of the first embodiment and the above examples, etching includes a plasma etch, a wet etch, or a combination thereof. For example, the plasma etch includes a fluorine containing plasma etch.

In a further example of the first embodiment and the above examples, the method further includes depositing the insulator layer by chemical vapor deposition. For example, the insulator layer includes silicon dioxide, silicon nitride, a silicon oxide formed from tetraethylortho silicate, or a combination thereof.

In an additional example of the first embodiment and the above examples, the sensor is formed from zinc, copper, aluminum, tantalum, titanium, tungsten, gold, silver, oxides thereof, nitrides thereof, or combinations thereof.

In a second embodiment, a method for manufacturing a sensor includes applying a conformal conductive layer over an insulator layer and in an opening exposing a sensor surface of a sensor disposed on a substrate and removing the conformal conductive layer from an upper surface of the insulator to form conductive cup structures disposed in the openings and contacting the sensor surface. A native oxide forms on the conductive cup structure. The method further includes annealing the conductive cup structure in a hydrogen containing atmosphere and annealing the conductive cup structure in an oxygen atmosphere at a temperature of not greater than 400° C.

In an example of the second embodiment, applying the conformal conductive layer includes sputtering a conductive material. For example, the conductive material comprises titanium, tantalum, hafnium, tungsten, aluminum, copper, gold, silver, or any combination thereof.

In another example of the second embodiment and the above examples, removing the conformal conductive layer includes coating the conformal conductive layer with a photoresist layer. In an example, the method further includes etching the photoresist and conformal conductive layer to remove the conductive layer from the upper surface of the insulator and removing the photoresist. In a further example, the method includes planarizing to remove the conformal conductive layer from the upper surface of the insulator and removing the photoresist.

In a further example of the second embodiment and the above examples, the method further includes supporting the sensor surface with a noble gas prior to applying the conformal conductive coating. For example, sputtering with a noble gas include sputtering with argon. In an example, sputtering includes sputtering at a power in a range of 100 W to 400 W.

In an additional example of the second embodiment and the above examples, annealing the conductive cup structure in an oxygen containing atmosphere includes annealing at a temperature in a range of 290° C. to 380° C. For example, the temperature is in a range of 300° C. to 370° C., such as in a range of 330° C. to 360° C.

In another example of the second embodiment and the above examples, annealing the conductive cup structure in an oxygen containing atmosphere includes annealing for a period in a range of 5 minutes to 120 minutes. For example, the period is in a range of 10 minutes to 80 minutes, such as in a range of 15 minutes to 60 minutes.

In a further example of the second embodiment and the above examples, annealing in a hydrogen containing atmosphere includes annealing at a temperature in a range of 350° C. to 500° C. For example, annealing in the hydrogen containing atmosphere includes annealing at a temperature in a range of 400° C. to 450° C.

In an additional example of the second embodiment and the above examples, the method further includes etching the conductive cup structure following annealing in a hydrogen containing atmosphere and before annealing in an oxygen containing atmosphere.

In another example of the second embodiment and the above examples, etching the conductive cup structure following annealing in the hydrogen containing atmosphere includes etching in a vapor hydrogen fluoride atmosphere.

In a further example of the second embodiment and the above examples, the sensor is formed from zinc, copper, aluminum, tantalum, titanium, tungsten, gold, silver, oxides thereof, nitrides thereof, or combinations thereof.

In a third embodiment, an apparatus includes a substrate including circuitry formed on or in the substrate, the circuitry including an array of sensors, each sensor has a sensor surface associated with an opening and formed by the method of any one of the above embodiments and examples.

Note that not all of the activities described above in the general description or the examples are required, that a portion of a specific activity may not be required, and that one or more further activities may be performed in addition to those described. Still further, the order in which activities are listed are not necessarily the order in which they are performed.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

As used herein, the terms "comprises," "comprising," "includes," "including," "has," "having" or any other variation thereof, are intended to cover a non-exclusive inclusion. For example, a process, method, article, or apparatus that comprises a list of features is not necessarily limited only to those features but may include other features not expressly listed or inherent to such process, method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" are employed to describe elements and components described herein. This is done merely for convenience and to give a general sense of the scope of the invention. This description should be read to include one or at least one and the singular also includes the plural unless it is obvious that it is meant otherwise.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

After reading the specification, skilled artisans will appreciate that certain features are, for clarity, described herein in the context of separate embodiments, may also be provided in combination in a single embodiment. Conversely, various features that are, for brevity, described in the context of a single embodiment, may also be provided separately or in any subcombination. Further, references to values stated in ranges include each and every value within that range.

What is claimed is:

1. A method for manufacturing a sensor, the method comprising:
    etching an insulator layer disposed over a substrate to define an opening exposing a sensor surface of a sensor disposed on the substrate, a native oxide forming on the sensor surface;
    annealing the sensor surface in a hydrogen containing atmosphere following the etching; and
    annealing the senor surface in an oxygen atmosphere at a temperature in a range of 290° C. to 380° C. following the annealing in the hydrogen containing atmosphere.

2. The method of claim 1, wherein the temperature is in a range of 300° C. to 370° C.

3. The method of claim 1, wherein the temperature is in a range of 330° C. to 360° C.

4. The method of claim 1, wherein annealing the sensor surface in an oxygen containing atmosphere includes annealing for a period in a range of 5 minutes to 120 minutes.

5. The method of claim 4, wherein the period is in a range of 10 minutes to 80 minutes.

6. The method of claim 4, wherein the period is in a range of 15 minutes to 60 minutes.

7. The method of claim 1, wherein annealing in a hydrogen containing atmosphere includes annealing at a temperature in a range of 350° C. to 500° C.

8. The method of claim 7, wherein annealing in the hydrogen containing atmosphere includes annealing at a temperature in a range of 400° C. to 450° C.

9. The method of claim 1, further comprising etching the sensor surface following annealing in a hydrogen containing atmosphere and before annealing in an oxygen containing atmosphere.

10. The method of claim 9, wherein etching the sensor surface following annealing in the hydrogen containing atmosphere includes etching in a vapor hydrogen fluoride atmosphere.

11. The method of claim 1, wherein etching includes a plasma etch, a wet etch, or a combination thereof.

12. The method of claim 11, wherein the plasma etch includes a fluorine containing plasma etch.

13. The method of claim 1, further comprising depositing the insulator layer by chemical vapor deposition.

14. The method of claim 13, wherein the insulator layer includes silicon dioxide, silicon nitride, a silicon oxide formed from tetraethylortho silicate, or a combination thereof.

15. The method of claim 1, wherein the sensor is formed from zinc, copper, aluminum, tantalum, titanium, tungsten, gold, silver, oxides thereof, nitrides thereof, or combinations thereof.

16. A method for manufacturing a sensor, the method comprising:
    applying a conformal conductive layer over an insulator layer and in an opening exposing a sensor surface of a sensor disposed on a substrate;
    removing the conformal conductive layer from an upper surface of the insulator to form conductive cup structures disposed in the openings and contacting the sensor surface, a native oxide forming on the conductive cup structure
    annealing the conductive cup structure in a hydrogen containing atmosphere; and
    annealing the conductive cup structure in an oxygen containing atmosphere at a temperature in a range of 290° C. to 380° C. following the annealing in the hydrogen containing atmosphere.

17. The method of claim 16, wherein applying the conformal conductive layer includes sputtering a conductive material.

18. The method of claim 17, wherein the conductive material comprises titanium, tantalum, hafnium, tungsten, aluminum, copper, gold, silver, or any combination thereof.

19. The method of claim 16, wherein removing the conformal conductive layer includes coating the conformal conductive layer with a photoresist layer.

20. The method of claim 19, further comprising:
    etching the photoresist and conformal conductive layer to remove the conductive layer from the upper surface of the insulator; and
    removing the photoresist.

* * * * *

UNITED STATES PATENT AND TRADEMARK OFFICE
CERTIFICATE OF CORRECTION

| | | |
|---|---|---|
| PATENT NO. | : 12,140,557 B2 | Page 1 of 1 |
| APPLICATION NO. | : 17/267772 | |
| DATED | : November 12, 2024 | |
| INVENTOR(S) | : Phil Waggoner et al. | |

It is certified that error appears in the above-identified patent and that said Letters Patent is hereby corrected as shown below:

In the Claims

Column 12, Claim 14, Line 14, delete "tetraethylortho silicate," and insert -- tetraethyl orthosilicate, --, therefor.

Column 12, Claim 16, Line 30, delete "structure" and insert -- structure; --, therefor.

Signed and Sealed this
Twenty-first Day of January, 2025

Coke Morgan Stewart
*Acting Director of the United States Patent and Trademark Office*